(12) United States Patent
Tabatabaei

(10) Patent No.: US 7,292,947 B1
(45) Date of Patent: Nov. 6, 2007

(54) SYSTEM AND METHOD OF ESTIMATING PHASE NOISE BASED ON MEASUREMENT OF PHASE JITTER AT MULTIPLE SAMPLING FREQUENCIES

(75) Inventor: Sassan Tabatabaei, Sunnyvale, CA (US)

(73) Assignee: Guide Technology, Inc., Sunnyvale, CA (US)

( * ) Notice: Subject to any disclaimer, the term of this patent is extended or adjusted under 35 U.S.C. 154(b) by 0 days.

(21) Appl. No.: 11/453,282

(22) Filed: Jun. 14, 2006

(51) Int. Cl.
*G01R 29/26* (2006.01)
*G06F 15/00* (2006.01)

(52) U.S. Cl. .................. 702/69; 702/74; 702/191

(58) Field of Classification Search .................. 702/69, 702/72, 74, 189, 190, 191; 375/238, 260, 375/376
See application file for complete search history.

(56) References Cited

U.S. PATENT DOCUMENTS 6,185,509 B1 * 2/2001 Wilstrup et al. .............. 702/69
6,356,850 B1 * 3/2002 Wilstrup et al. .............. 702/69

* cited by examiner

*Primary Examiner*—Bryan Bui
(74) *Attorney, Agent, or Firm*—Dority & Manning, P.A.

(57) ABSTRACT

A system and method of estimating random and periodic phase noise components based on measurement of phase jitter in a given signal uses a difference filter to attenuate low frequency random noise components and a process of obtaining timing measurements at a plurality of sampling frequencies in order to de-alias identified noise spurs. Such technology is especially well-suited for devices capable of undersampling a jitter signal, such as continuous time interval analyzers (CTIAs).

50 Claims, 4 Drawing Sheets

SYSTEM AND METHOD OF ESTIMATING PHASE NOISE BASED ON MEASUREMENT OF PHASE JITTER AT MULTIPLE SAMPLING FREQUENCIES

BACKGROUND OF THE INVENTION

In general, an integrated circuit refers to an electrical circuit contained on a single monolithic chip containing active and passive circuit elements. As should be well understood in this art, integrated circuits are fabricated by diffusing and depositing successive layers of various materials in a preselected pattern on a substrate. The materials can include semiconductive materials such as silicon, conductive materials such as metals, and low dielectric materials such as silicon dioxide. The semiconductive materials contained in integrated circuit chips are used to form almost all of the ordinary electronic circuit elements, such as resistors, capacitors, diodes, and transistors.

Integrated circuits are used in great quantities in electronic devices such as digital computers because of their small size, low power consumption and high reliability. The complexity of integrated circuits ranges from simple logic gates and memory units to large arrays capable of complete video, audio and print data processing, including devices for operation in radio frequency (RF) applications. As the semiconductor industry strives to meet technological demands for faster and more efficient circuits, integrated circuit chips and assemblies are created with reduced dimensions, higher operating speeds and reduced energy requirements. As integrated circuit signal speeds increase, timing errors and pulse width deviations within such signals may constitute a greater portion of a signal period than the signal itself.

Timing fluctuations in integrated circuit signals are generally referred to as "jitter". Jitter can be broadly defined in certain interpretations as variation of a signal edge from its ideal position in time, and is an important performance measure for integrated circuit signals, including serial links and clock signals.

Phase noise is another signal performance parameter that is directly related to signal timing jitter. Exemplary references that discuss the one-to-one relationship between phase noise and timing jitter include "*Time Domain Analysis and Its Practical Application to the Measurements of Phase Noise of Jitter*," by L. Cosart, L. Peregrino and A. Tambe, as published in *IEEE Transaction on Instrumentation and Measurement*, Vol. 46, No. 4, August 1977; "*Phase Noise and Timing Jitter in Oscillators*," by A. Demir, A. Mehrotra and J. Roychowdhury, as published in *IEEE Custom Integrated Circuits Conference*, 1998, pp. 45-48; "*Jitter and Phase Noise in Ring Oscillators*," by A. Hajimiri, S. Limotyrakis and T. Lee, as published in *IEEE Journal of Solid-State Circuits*, Vol. 34, No. 6, June 1999; and "*An Analytical Formulation of Phase Noise in Signals with Gaussian-distributed Jitter*," by R. Navid, T. Lee and R. Dutton, as published in *IEEE Transaction on Circuits and Systems*—II: Express Brief, Vol. 52, No. 3, March 2005.

Phase noise is a measure of clock signal purity that is often used in the field of RF circuitry and devices to qualify the impact of oscillator noise on the performance of an RF link. A clock signal may be characterized as having amplitude noise and signal phase variations or phase jitter, both of Which may be due to both random and periodic sources. These noises can result in spreading of signal energy in a wider frequency range and reduction of energy at a given RF carrier frequency. Such spectral spreading negatively affects the quality of communication in an RF link. Spectral spreading due to phase jitter is referred to as phase noise. Oscillators are often qualified with their phase noise characteristics.

The measurement and determination of signal jitter and phase noise, including the various components thereof, is imperative in characterizing the performance of integrated circuits, especially in the production and testing stages of integrated circuit manufacturing. Various devices, including time interval analyzers, counter-based measurement devices, bit-error-rate analyzers, and oscilloscopes, have been developed to measure various signal timing deviations, including jitter.

An example of a time interval analyzer that may be employed to measure high frequency circuit signals and determine various aspects of signal timing deviations is disclosed in U.S. Pat. No. 6,091,671 (Kattan), which is assigned to the present applicants' assignee, Guide Technology, Inc. The time interval analyzer disclosed in Kattan measures jitter, including total cycle-to-cycle jitter, by determining deviations between one or more of the amplitude, phase, and/or pulse width of real signal pulses and ideal signal pulses.

Other examples of time measurement devices that could be configured to measure signal timing variations are disclosed in U.S. Pat. No. 6,194,925 (Kimsal et al.) and U.S. Pat. No. 4,757,452 (Scott et al.) Kimsal et al. discloses a time interval measurement system in which a voltage differential across a hold capacitor generated between events occurring in an input signal determines the time interval between events. Scott et al. provides a system for measuring timing jitter of a tributary data stream that has been multiplexed into a higher-rate multiplex stream using pulse stuffing techniques. Scott et al. is an event counter based system that does not directly measure time intervals but determines their frequency by maintaining a continuous count of the number of pulses occurring within a signal. Still further, U.S. Pat. No. 4,908,784; (Box et al.) discloses a measurement apparatus configured to measure the time interval between two events (start and stop) through counters.

Several measurement devices and methodology for measuring periodic jitter and jitter spectrum are known. One exemplary approach uses an oscilloscope with a high sampling rate and analytical signal method, such as disclosed in "*Extraction of Peak-to-peak and RMS Sinusoidal Jitter Using an Analytic Signal Method*," by T. Yamaguchi and M. Soma, as published in *IEEE VLSI Test Symposium*, 2000, pp. 395-402. Another approach involves an autocorrelation method with high sampling rate oscilloscopes. U.S. Pat. No. 6,898,535 (Draving) discloses a method for determining signal jitter using complete signal edge sampling and Fourier transforms. Additional techniques involve autocorrelation methods with undersampling data sets generated by time interval analyzers. Examples of such techniques are disclosed in "*A Method of Serial Data Jitter Analysis Using One-Shot Time Interval Measurements*," by J. Wilstrup, as published at *Intl. Test Conference*, 1998, pg. 819-823, and in "*Jitter Spectrum Analysis Using Time Interval Analyzer (CTIA)*," by S. Tabatabaei, Freddy Ben-Zeev and T. Farahmand, as published at *Intl. Test Conference*, 2005, pg. 198-207. Still further technological examples for measuring periodic jitter and jitter spectrum involve BERT (Bit Error Ratio Testing) methods, such as disclosed in "*Jitter Fundamentals: 81250 ParBERT Jitter Injection and Analysis Capabilities*," published by Agilent Technologies as Application Note 5988-9756EN on Jul. 17, 2003. Finally, "*Jitter Spectrum Analysis Using Time Interval Analyzer (CTIA)*", by S. Tabatabaei, Freddy Ben-Zeev and T. Farahmand, as published at *Intl. Test Conference,* 2005, pg. 198-207, discloses a random sampling method with undersampled signal edge timing data.

The BERT method mentioned above typically has very limited dynamic range. The FFT and autocorrelation methods respectively rely on complete signal edge timing information and are typically suitable for use with high sampling rate oscilloscopes. Such methods can be used for characterization applications, but can be costly for production applications.

TIAs and CTIAs lend themselves better for production applications due to efficient edge sampling. However, their sampling rate is typically limited to a few MHz. The autocorrelation and random sampling methods allow periodic jitter and jitter spectrum measurement, but the result does not provide sufficient dynamic range for phase noise measurement.

Although the above examples and others exist for measuring and analyzing various aspects of signal jitter and related performance characteristics including phase noise, no one design exists that encompasses all features and aspects of the present invention.

All the aforementioned patents and other references are incorporated herein by reference for all purposes.

SUMMARY OF THE INVENTION

In view of the recognized features encountered in the prior art and addressed by the present subject matter, features and steps for estimating phase noise for measured signals have been developed. Varied exemplary embodiments of a system and method for estimating phase noise for a measured signal are hereafter presented, selected of which offer such advantages as providing a relatively cost-effective and reliable procedure for estimating periodic jitter and phase noise components with both a very high resolution level and dynamic range.

More particularly, embodiments of the present invention utilize a multiple sampling frequency (MSF) methodology and other techniques to estimate periodic jitter and phase noise components while simultaneously achieving very high resolution levels and dynamic range capabilities. Such sampling methodology affords advantages in embodiments of the present technology because of its relatively simple process, which reduces computations and measurement time.

Phase jitter and phase noise in oscillators are closely related to each other. Therefore, one may be obtained from measuring another. Depending on the application, it may be advantageous to measure phase jitter using a production oriented instrument to achieve more cost-effective overall solution. Continuous time interval analyzers (CTIAs) are a capable instrument for measuring a variety of timing and phase parameters, including phase jitter, fairly accurately. These measurements provide an estimate of phase noise, which is a critical performance parameter for oscillators.

One exemplary embodiment of the disclosed technology uses two major techniques, one based on a difference filter to reduce the impact of low frequency random noise and another based on multiple sampling rate measurements to perform de-aliasing. The combination of these techniques yield a powerful method for phase noise measurement with high resolution and dynamic range in a fraction of the time that a spectrum analyzer would need to obtain comparable measurements.

In additional exemplary embodiments, a number of implementation techniques may be used to enhance accuracy and reduce test time. These techniques include spectrum averaging, difference filter amplitude effect correction, and peak detection.

In one exemplary embodiment of the present invention, a method of measuring signal jitter using a multiple sampling frequency method includes a first step of obtaining a plurality of time measurements in multiple respective blocks of measurements. The time measurements may correspond, for example, to time-stamps in some embodiments and to time interval measurements in other embodiments. Such method further includes the steps of determining from the obtained time measurements the frequency and amplitude of noise spurs in each block of measurements, and de-aliasing the noise spurs to determine their real frequency of occurrence.

The time measurements may be obtained with a given sampling rate and time interval span per block. In some embodiments, these parameters are chosen to be constant in each block. In some embodiments, at least two different sampling intervals are employed. One exemplary sampling interval arrangement utilizes a sampling interval equal to some prime number (P) of the clock or data cycles in at least one block of measurements, and respective sampling intervals of P+1 and/or P−1 in at least one other block of measurements.

In more particular exemplary embodiments, a step of applying a mapping function to each noise spur is used to obtain an estimate of phase noise spurs from the periodic signal jitter measurements. In other more particular embodiments, the step of determining the frequency and amplitude of noise spurs in each block of measurements further involves the steps of determining an average time interval for each block, subtracting the average time interval from the measured samples in each block; transforming the time interval values into a plurality of frequency sequences (e.g., by performing a fast Fourier transform), averaging selected frequency sequences to smooth noise floor in the samples; and detecting frequency peaks from each averaged set of frequency sequences. Zero values may be added to each block of measurements from the obtaining step such that the total number of measurements in each block including added zero values is equal to a power of two. A windowing function may also be applied to each time interval to reduce windowing sidelobes.

In another exemplary embodiment of the present technology, a method of estimating phase noise of a signal from signal jitter measurements includes at least a first step of obtaining at a first sampling rate a first set of time-stamp measurements for a plurality of signal edges within a given signal, and a second step of using the first set of obtained measurements to estimate the frequency and amplitude of signal peaks in the phase jitter spectrum. In other embodiments, additional sets of time-stamp measurements are obtained at other respective sampling rates. Sometimes at least two different sampling rates are employed.

In other more particular exemplary embodiments, the given signal may be filtered (e.g., via a difference filter) to attenuate low frequency noise levels. When a difference filter is used, additional measures can be taken to reduce the possibility the signal peaks are not detected due to nulls of the different filter. One measure involves obtaining blocks of measurements for each different sampling rate such that the number of clock or data cycles corresponding to the time interval in each block is different from that of other blocks.

Further, an amplitude correction step may be employed to correct the amplitude of each signal peak if modulated by the difference filter.

In other exemplary embodiments, the process of obtaining time-stamp measurements may more particularly include such steps as obtaining a plurality of time interval measurements in multiple respective blocks of measurements of the phase signal, wherein a sampling interval and time interval span is selected to be constant in each block, determining from the plurality of obtained time interval measurements the frequency and amplitude of noise spurs in each respective block of measurements, and de-aliasing the noise spurs from the determining step to determine their real frequencies of occurrence. In some embodiments, the sampling interval selected in the obtaining step corresponds to a prime number (P) of clock or data cycles for at least one block of measurements, P−1 for at least one block of measurements and/or P+1 for at least one block of measurements.

Still further exemplary embodiments involve a step of estimating random phase noise of the signal. This might be accomplished by removing frequency peaks in the signal representative of spurious noise, and determining an estimate of random phase noise modeled by $1/f^2$ behavior. $1/f^2$ behavior may be characterized by the standard deviation of the random jitter and the oscillator frequency. The estimate of random phase noise and the determined periodic noise spurs may be combined to obtain a complete phase noise estimate.

It should be appreciated that the present subject matter equally concerns an apparatus and system for implementing the aforementioned exemplary steps. For example, a processor circuit may be coupled to one or more measurement channels that obtain the signal measurements and may be configured to perform such steps as outlined above. In one embodiment, such a processor circuit more particularly includes a computer-readable medium for storing executable instructions corresponding to the aforementioned steps and other steps desired in the subject signal analysis. The computer-readable medium may correspond to one or more of a server database, a magnetic tape or disk, a CD-ROM, an EEPROM, flash or other nonvolatile memory, etc. The exact type of memory or storage medium should not be limiting to the present invention. The processor circuit may further include a computer coupled to the readable medium that is adapted to execute the software instructions stored on the computer-readable medium.

The accompanying drawings, which are incorporated in and constitute a part of this specification, illustrate one or more embodiments of the present subject matter, and together with the description serve to explain certain principles of the disclosed technology. Additional embodiments of the present subject matter may incorporate various steps or features of the above-referenced embodiments, and the scope of the presently disclosed technology should in no way be limited to any particular embodiment. Additional objects, features and aspects of the present subject matter and corresponding embodiments are discussed in greater detail below.

BRIEF DESCRIPTION OF THE DRAWINGS

A full and enabling disclosure of the present subject matter, including the best mode thereof, directed to one of ordinary skill in the art, is set forth in the specification, which makes reference to the appended drawings, in which.

Figure 1:
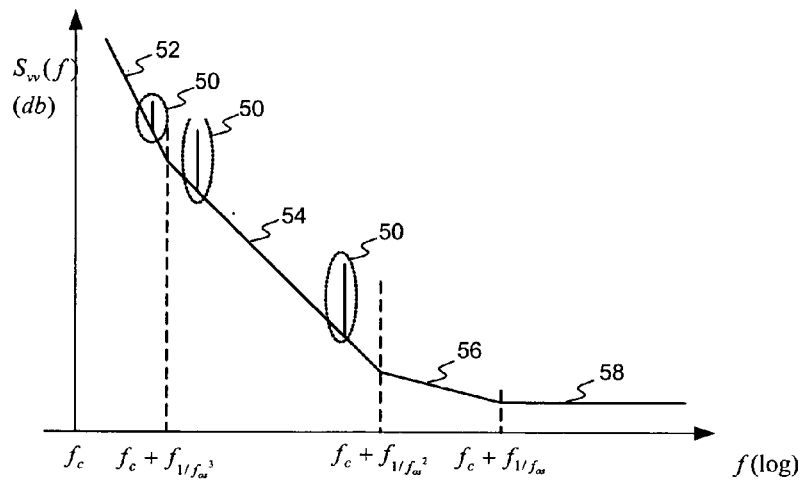
FIG. 1 provides a theoretical graphical representation of phase noise behavior for an exemplary clock signal, specifically represented by the power spectrum density $S_{vv}(f)$ versus frequency.

Repeat use of reference characters in the present specification and drawings is intended to represent same or analogous features or elements of the present subject matter.

DETAILED DESCRIPTION OF EXEMPLARY EMBODIMENTS

Reference will now be made in detail to presently preferred embodiments of the disclosed technology, exemplary aspects of which are illustrated in the accompanying drawings. The presently disclosed description is provided by way of explanation of the present technology, not limitation of the present technology. In fact, it will be apparent to those skilled in the art that modifications and variations can be made in the present technology without departing from the scope and spirit thereof. For instance, features or steps illustrated or described as part of one embodiment may be used on another embodiment to yield a still further embodiment. Thus, it is intended that the present subject matter covers such modifications and variations as come within the scope of the appended claims and their equivalents.

Defining Phase Noise:

It should be appreciated that the following notations and definitions provided in Table One are used throughout this specification to refer to various parameters associated with the disclosed technology.

TABLE ONE

| | NOTATIONS AND DEFINITIONS |
|---|---|
| E | Event number for the sampled START edges |
| ΔE | The event difference between the start of two adjacent samples |
| $t_{st}$ | Time tags for the start of samples |
| TI | The pulse widths or time interval samples |

TABLE ONE-continued

NOTATIONS AND DEFINITIONS

| | |
|---|---|
| $E_{TI}$ | The number of events between START and STOP edges of time interval sample P |
| $N_{TI\_bits}$ | The number of data bits within P |
| B(k, m) | The block of data with k-the sampling interval and m-th time interval span. |
| $T_c$ | The period estimate for the clock signal under test |
| $f_c = 1/T_c$ | The main frequency of the signal under test |
| De-aliasing | Finding the real frequency of signal sinusoidal components when the sampling rate is less that twice that of the sinusoid frequencies. |

Phase noise is a measure of clock signal purity. It is often used in the field of radio frequency (RF) circuitry and devices to qualify the impact of oscillator noise on the performance of an RF link. A clock signal can be modeled as below in Eqn. 1:

$$v(t)=(1+n(t)) \cdot \cos(\omega_0 t+\phi(t)) \quad Eqn. 1$$

where v(t) is a clock signal with the frequency of $f_0=\omega_0/(2\pi)$, n(t) is the amplitude noise, and $\phi(t)$ represents the signal phase variations or phase jitter. The energy of an ideal clock signal $v_{NF}(t)=\cos(\omega_0 t)$ is concentrated at the carrier frequency $f_0$. But the n(t) and $\phi(t)$ noises can result in spreading of the energy in a wider frequency range and reduction of the energy at the carrier frequency. The spectral spreading negatively affects the quality of communication in a RF link. The spectral spreading due to $\phi(t)$ is referred to as phase noise.

Both n(t) and $\phi(t)$ may be due to random and periodic sources. n(t) typically is a much smaller contributor to oscillator noise because of two reasons. First, many oscillators include limiting amplifiers at their output, which reduce the amplitude noise significantly, but not the phase noise. Second, the spectrum of random amplitude noise typically exhibit two behaviours, flat and $1/f_{os}$ characteristics, where $f_{os}$ if the frequency offsets relative to the carrier frequency. In contrast, random phase noise major components typically have $1/f_{os}^2$ and $1/f_{os}^3$ characteristics. FIG. 1 illustrates the power spectrum density, $S_{vv}(f)$, of the clock signal modeled in Eqn. 1. Periodic phase noise, often referred to as spurious phase noise or "spurs" are represented in FIG. 1 by noise spikes 40. Portion 42 of the phase noise plot illustrated in FIG. 1 represents phase noise due to 1/f noise sources, while portion 44 represents phase noise due to white noise sources. Portion 46 of the phase noise plot illustrated in FIG. 1 represents amplitude noise due to 1/f noise sources, while portion 48 represents amplitude noise due to white noise sources.

It should be realized from FIG. 1 that the phase noise power at frequencies close to the main carrier $f_0$ is typically one or two orders of magnitude larger than the amplitude related noise power. Therefore, the oscillator-related noise passed through the narrow band filters used in RF systems is mostly due to the phase noise rather than amplitude noise.

As such, oscillators are often qualified with their phase noise characteristics. The process disclosed herein assumes that n(t) is negligible and considers only $\phi(t)$:

$$v_{PN}(t)=\cos(\omega_0 t+\phi(t)) \quad Eqn. 2$$

Many oscillators, especially the ones based on phase-locked loops (PLL), generate periodic non-sinusodial outputs. In such cases, typically the main harmonic is filtered and used for RF operation. Therefore, although the description herein is based on sinusoidal clock assumption, it should be appreciated that the disclosed technology also applies to non-sinusoidal clocks.

Figure 2A:
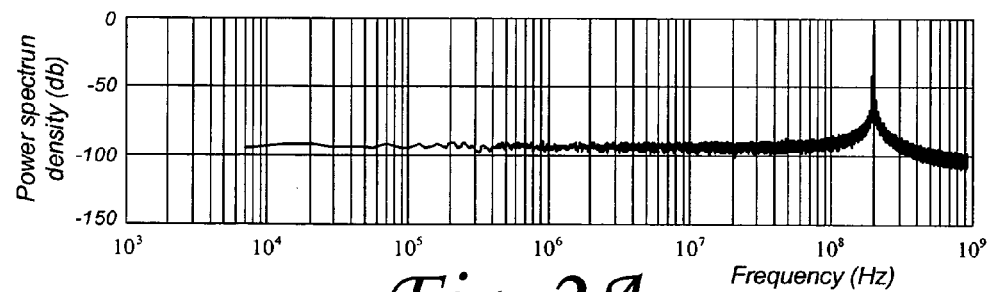
FIG. 2A provides a graphical illustration of phase noise associated with a 200 MHz clock signal, specifically represented by the power spectrum density in decibels (dB) versus frequency in Hertz (Hz)
Figure 2B:
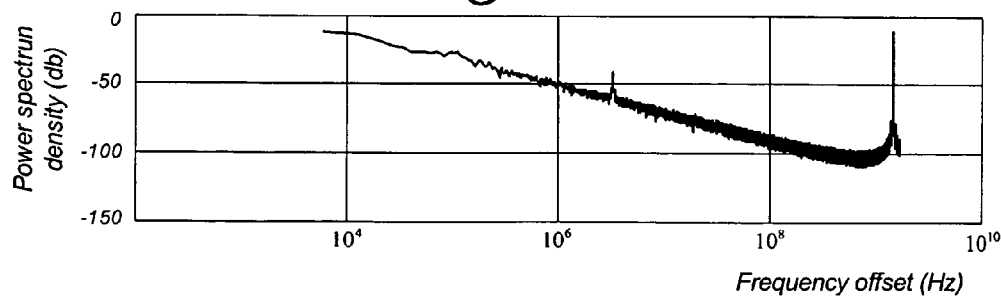
FIG. 2B provides a graphical illustration of phase noise associated with a 200 MHz clock signal, specifically represented by the power spectrum density in decibels (dB) versus frequency offset from the carrier frequency measured in Hertz (Hz)

The phase noise is often analyzed by observing $v_{PN}(t)$ in frequency domain. This method clearly shows how the phase jitter causes the energy to spread in a frequency range around the carrier frequency. FIG. 2A shows the spectrum of a 200 MHz sinusoidal clock signal with a random white period jitter, also known as random walk phase jitter and two spurious components. The energy spread around the carrier is evident from this plot. FIG. 2B shows the phase noise plot for the same signal versus the offset frequency from the carrier. The well-known $1/f^2$ phase noise characteristic is clearly visible. In practice, this form of phase noise is common for many oscillators because of thermal noise sources in the oscillators. Other practical sources of phase noise are discussed later in more detail.

The phase noise is plotted as a log-log plot of $S_{vv}(f)=|V_{PN}(f)|^2$, where $S_{vv}(f)$ is the power spectrum density function of $v_{PN}(t)$, $V_{PN}(f)$ is the Fourier transform of $v_{PN}(t)$, and the $f_{os}=f-f_c$ is the offset frequency from the carrier frequency. Another method of observing the phase noise characteristic is to modulate $v_{PN}(t)$ by $v_{NF}(t)$ and its quadrature component, and then observing the baseband spectrum:

$$PN(t)=|\exp(-j\phi(t))| \quad Eqn. 3$$

Eqn. 3 shows the fundamental relationship between the phase noise PN(t) and phase jitter $\phi(t)$.

Phase Noise Sources and Characteristics:

Phase noise may have many sources, such as thermal, device flicker and shot noises, power supply noise, coupling noise, etc. These sources may cause both random and periodic noise characteristics. The random phase noise is expressed as the power in 1 Hz bandwidth relative to the carrier power in dB, and denoted as dBc/Hz. The dBc/Hz specifications at given frequency offsets provide a measure of phase noise that can be used to compare the signal purity of different oscillators. The periodic phase noise is referred to spurious phase noise or spur. These components are expressed as dBc or dBc/Hz. Spurs are directly related to the phase jitter spectrum peaks due to sinusoidal jitter components.

With further reference to random noise characteristics, it should be appreciated that sources such as thermal and device noise sources are typical random noise sources. These sources cause the following phase noise characteristics:

a. $1/f^3$: This noise is due to the 1/f flicker noise in the oscillator devices affecting the oscillator period. CMOS devices specially are susceptive to this type of noise. $1/f^3$ is typically dominant in a very narrow frequency range close to the carrier, but it quickly diminishes at larger offset frequency.

b. $1/f^2$: This noise is due to white noise sources such as thermal noise in the oscillators. $1/f^2$ Behavior is due to the accumulative nature of period noise when observed as phase.

c. 1/f: This noise is due to the amplitude flicker noise sources. Regions with this characteristic may or may not be visible in the phase noise plot depending on the relative strength of different noise types. Another source of this noise is the 1/f phase jitter in the buffer stages at the output of the oscillator.

d. Flat: This noise is due to amplitude white noise n(t) and phase white noise from devices, such as buffers, that may be placed at the output of the oscillator. This behavior can be observed at larger offset frequencies, where the $1/f^2$ is reduced significantly and the flat noise becomes dominant. Another source of this noise are the white phase jitter in the buffer stages at the output of the oscillator.

With further reference to periodic noise characteristics, it should be appreciated that sources such as coupling sources to the oscillator and periodic switching inside the frequency generator circuit are typical periodic noise sources. This is especially true for fractional and fractional-N PLLs. These components appear as distinct lines in the power spectrum density function.

Phase Noise Measurement with Spectrum Analyzer:

Spectrum analyzers are a conventional choice of laboratory equipment for measuring phase noise. The spectrum analyzer sweeps a given frequency range and measures the power within a given bandwidth, which is known as resolution bandwidth or "RBW". There is a major difference between the way random phase noise and spurious are measured by a spectrum analyzer. More particularly, for random phase noise, the spectrum analyzer displayed characteristics should be divided by RBW to obtain the dBc/Hz specifications, because dBc/Hz is defined as power in 1 Hz bandwidth, whereas the spectrum analyzer has measured power in RBW bandwidth. Therefore, as RBW is reduced, the spectrum analyzer will display lower values of phase noise, but the value after dividing by RBW will not change (at the same offset frequency).

For spurious noise, the spectrum analyzer display is in fact the spurious peak and should not be divided by RBW. This is because the spurious energy is concentrated in a very narrow frequency range and therefore, the energy measured by the spectrum analyzer will not vary as RBW is changed.

Figure 3:
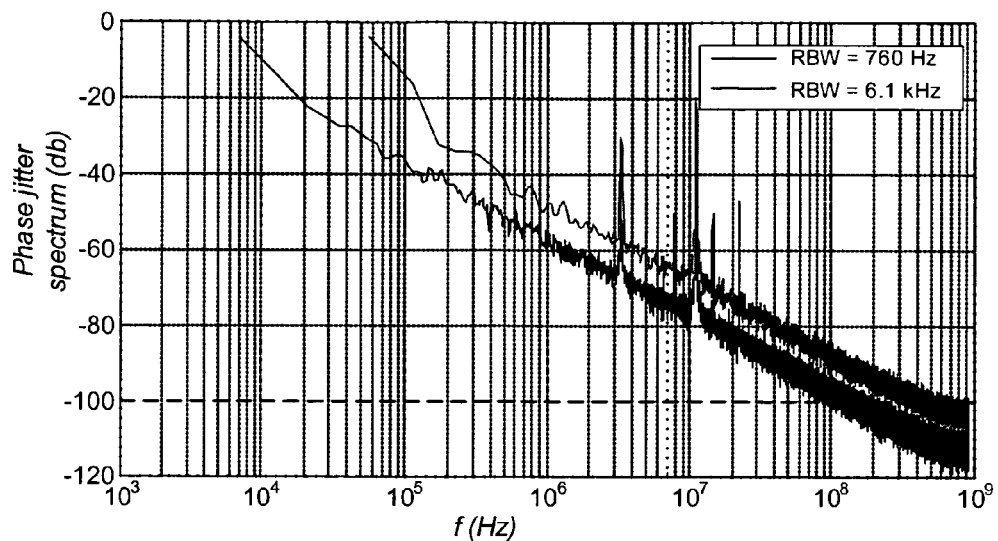
FIG. 3 provides a graphical illustration of phase noise, including random and spurious components, measured with two different resolution bandwidths (RBWs)

FIG. 3 illustrates the phase noise plot for different values of RBW. This plot clearly indicates how random phase noise curve scales with RBW, while spurious ones do not. In this plot, the random phase noise decreases by 10log(8)=9 db because the resolution bandwidth decreased by a factor of 8.

Phase Noise Measurement with Time Domain Instruments:

Eqn. 3 above indicates that measuring phase jitter signal $\phi(t)$ and using a mapping function can provide a phase noise estimate. This key relationship suggests that jitter measurement equipment can be used to estimate phase noise. For example, a high sampling rate time measurement instrument can provide an estimate of $\phi(t)$ by generating a time stamp for all edges of the signal within a given time window. Performing Fast Fourier Transform (FFT) on these phase deviations from ideal phases and using the frequency domain mapping function yields $|V_{PN}(f)|^2 \cdot |V_{PN}(f)|^2$ is typically subject to large statistical variations in each given frequency range due to statistical nature of random noise. To reduce such deviations, the $|V_{PN}(f)|^2$ is measured multiple times and their average is calculated to obtain the smooth phase noise power spectrum estimate $\overline{|V_{PN}(f)|^2}$.

Sinusoidal phase jitter measurement is an effective way to estimate phase noise spurs. A discussion of steps for measuring sinusoidal jitter using an undersampling Continuous Time Interval Analyzer (CTIA) will now be discussed. Additional discussion shows how the sinusoidal and random jitter measurements are used to estimate phase noise spurs and noise floor.

Figure 6:
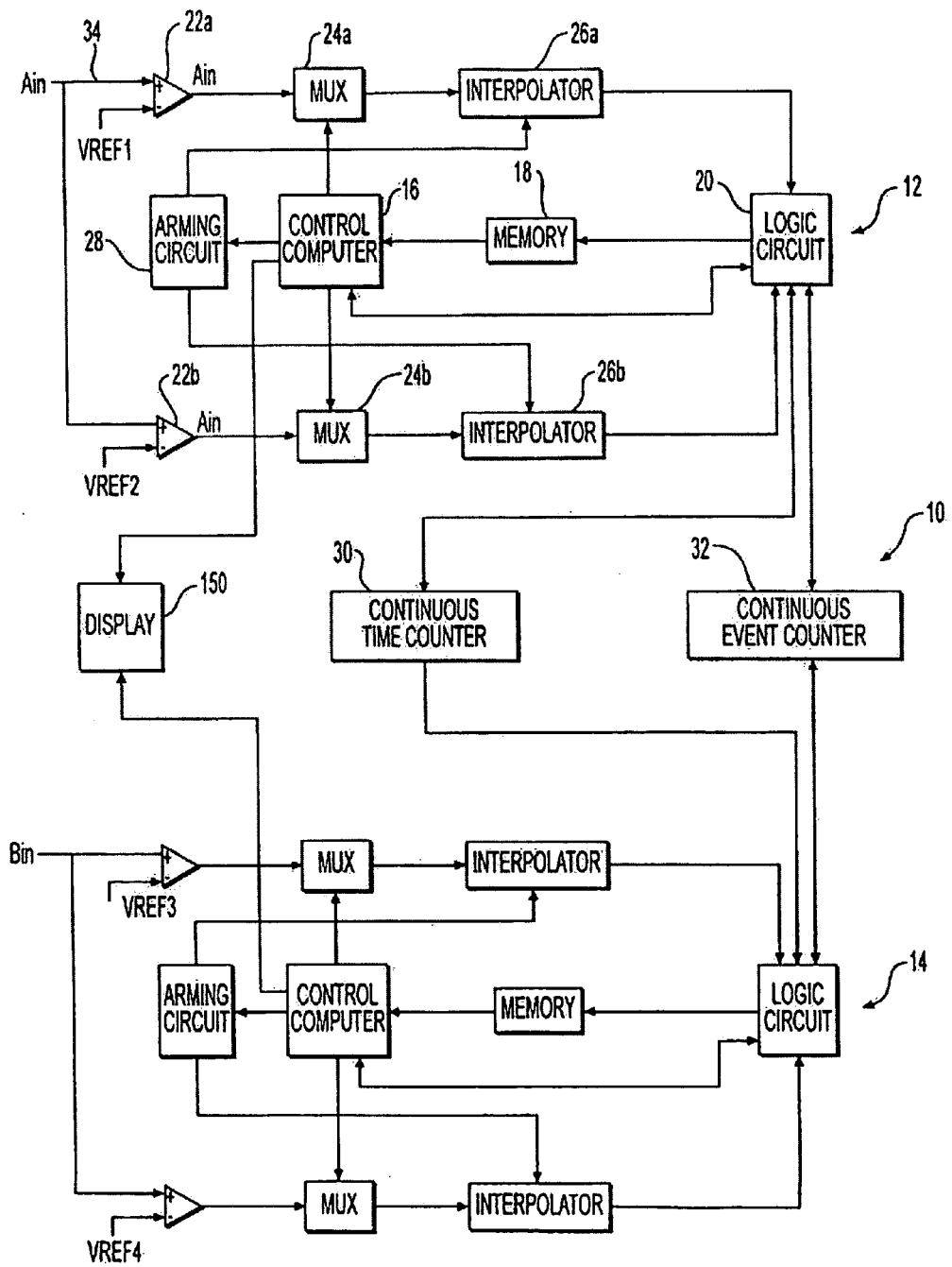
FIG. 6 provides a schematic diagram illustration of exemplary hardware components for obtaining and analyzing signal measurements in accordance with aspects of the presently disclosed technology.

Phase Jitter Measurement with a CTIA:

A discussion of how to measure sinusoidal phase jitter with a CTIA will be presented. These measurements can be used for estimating periodic jitter (PJ) in high-speed serial links, or measuring the phase noise spurs of a clock signal. A continuous time interval analyzer (CTIA) is an instrument capable of measuring time stamps of signal edges or threshold crossings relative to a unique reference. Examples of such devices were presented in the background of the invention section. A schematic representation of exemplary hardware components for obtaining and analyzing signal measurements in accordance with aspects of the present invention is provided. The hardware components illustrated in FIG. 6 are exemplary of those found in a FEMTO® 2000 or GT 4000 model time interval analyzer such as manufactured and sold by Guide Technology, Inc. of Sunnyvale, Calif. Although some aspects of the hardware components of FIG. 6 are discussed herein, additional discussion of these and other components of a measurement device that may be utilized in conjunction with certain aspects of the present invention are disclosed in U.S. Pat. No. 6,091,671 (Kattan), which is incorporated herein by reference for all purposes.

The time interval analyzer 10 of FIG. 6 includes two channels indicated at 12 and 14. Each channel includes a control computer 16, for example a 200 MHz DSP processor, with associated memory 18, for example a high performance FIFO memory, and logic circuit 20. Alternatively, the channels may share a common computer, memory and logic circuit, which may collectively be referred to as a processor circuit. Each channel, in turn, includes parallel measurement circuits having comparators 22a and 22b, multiplexers 24a and 24b and interpolators 26a and 26b. That is, each channel includes multiple, in this case, two measurement circuits. An arming circuit 28 is controlled by computer 16 to trigger the interpolators. A continuous time counter 30 and continuous event counter 32 provide time and event counts to both channels 12 and 14. Alternatively, each measurement circuit may have its own time counter and event counter, provided that the respective counters for each measurement circuit are synchronized.

The first measurement circuit 22a-26a/20 of each channel may be referred to as the "start" measurement circuit, while the second measurement circuit 22b-26b/20 may be referred to as the "stop" measurement circuit. Generally, time interval analyzer 10 measures characteristics of a desired signal by comparing the time and/or event measurements of the start circuit with that of the stop circuit. The particular measurement depends upon the signal selected at multiplexers 24a and 24b and upon the manner in which arming circuit 28 arms the interpolators. For example, if the start circuit passes the $A_{in}$ signal from comparator 22a as shown in FIG. 6, if the stop circuit multiplexer passes the inverse of the $A_{in}$ signal from comparator 22b, and if the interpolator 26b is armed immediately following interpolator 26a, but before the expiration of a period equal to the input signal pulse width, the difference between the time portions of the start and stop measurement tags is equal to the pulse width.

Once an interpolator has measured a signal edge, the logic circuit 20 instructs computer 16 to read the interpolator measurement from a capacitor within the interpolator whose charge or discharge is representative of a time signal that corresponds to the occurrence of the measured signal edge relative to a predetermined time reference. Computer 16 is also instructed to read the time and event counts from counters 30 and 32. It then downloads the time and event counts to memory 18, from which computer 16 retrieves the information to assign to the signal measurement. In this manner, the processor circuit correlates the measured signal edge with time and event measurements from the counters. Thus a "measurement tag" indicates the time the signal edge occurred and the edge's position within the sequence of edges.

Referring again to the exemplary phase jitter measurement method of the disclosed technology, the measured time stamps, $t_{st}(i)$, provide samples of phase signal $\phi(t)$ as below:

$$\varphi_s(i) = \varphi(t)|_{t=n_i \cdot T_c} = \frac{t_{st(i)}}{2\pi T_c} \qquad \text{Eqn. 4}$$

where $T_c$ is the average frequency of oscillator, and $n_i$ is a positive integer. CTIAs, however, may not be able to measure the time stamps for all edges in a time window due to the required re-arming time. Therefore, it may provide an undersampled sequence of $\phi(t)$ signal. The undersampling operation results in aliasing in frequency domain. Such aliasing may cause several possible issues. First, the maximum range of viewable frequencies will be limited to half the sampling rate. Second, the phase jitter frequencies will be aliased and their true frequencies cannot be determined. Third, the random noise floor at low frequencies can mask high frequency sinusoidal phase jitter components and render them undetectable.

The presently disclosed technology describes a measurement methodology to resolve these shortcomings. This method is based on two major techniques: (i) attenuation of low frequency noise in time domain, and (ii) de-aliasing based on multiple sampling rate measurements.

Figure 4A:
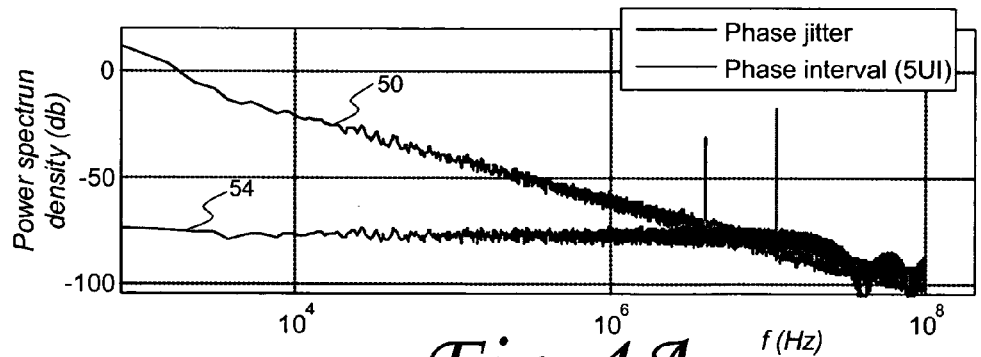
FIG. 4A provides a graphical illustration of phase jitter and five cycle phase interval spectrums for a 200 MHz oscillator measured with a full sampling rate.
Figure 4B:
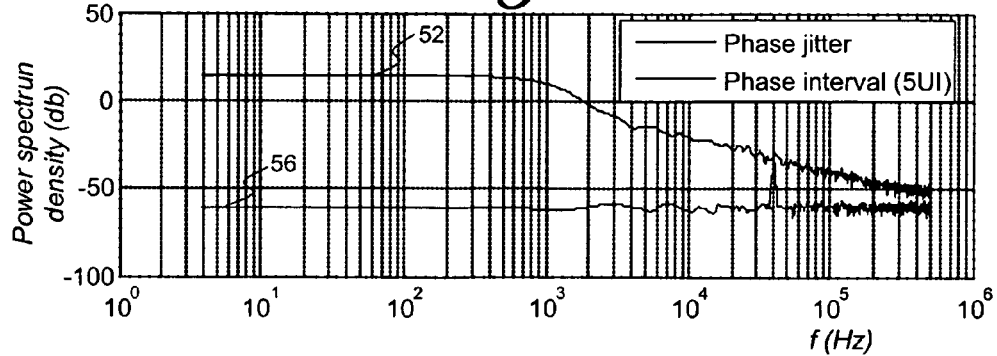
FIG. 4B provides a graphical illustration of phase jitter and five cycle phase interval spectrums for a 200 MHz oscillator measured with an undersampling ratio of two-hundred (200)

Low Frequency Noise Attenuation:

The typical $1/f^2$ phase jitter behavior gives rise to large noise power concentrated at low frequencies. Curve 50 in FIG. 4A shows the simulated phase jitter for a 200 MHz oscillator sampled at 200 Ms/s, i.e. the jitter is sampled at all the oscillator edges. The oscillator include $1/f^2$ random noise and some periodic jitter at high frequencies. The spurious peaks at higher frequencies can be observed because the random $1/f^2$ noise attenuates quickly at higher frequencies. Curve 52 in FIG. 4B shows the jitter spectrum for the same signal that is sampled at 1 Ms/s. This causes frequencies higher than 500 kHz to alias and appear at lower frequency range from 0 to 500 kHz. The large low frequency noise results in significant noise floor in the jitter spectrum, which overshadows the spurious peaks and makes them undetectable. This issue can greatly reduce the measurement dynamic range at higher frequencies, which would make meaningful phase noise measurement difficult.

Curve 54 in FIG. 4A and curve 56 in FIG. 4B show the spectrum of phase interval $2\pi(TI-\overline{TI})/TI$ for sampling rates of 200 Ms/s and 1 Ms/s, respectively, where TI is the time interval between and edge and its fifth preceding edge; in other words, five cycles span. In this case most of low frequency noise is attenuated by the action of the difference filter. Explanation of computation of the difference filter response is presented in more detail in the section entitled "Difference Filter". Upon undersampling, the spurs are detectable in the spectrum because the noise floor in reduced.

When using the above approach to detect the spurs, several issues should be considered. First, a spur may not be detectable if its true (un-aliased) frequency falls on a frequency close to the difference filter nulls, due to the severe filter attenuation. One possible solution to this issue involves selecting the time interval span such that the spur frequencies do not fall on the difference filter nulls. This, however, requires knowledge of the spur frequency, which may not be available. Another solution is to use multiple time interval spans; this moves the null frequencies. It is possible to choose two or three time interval spans to guarantee that a spur frequency will not fall on the null of at least one of those difference filters. A second potential issue for consideration is that the spur amplitude is modulated with the difference filter response, $D(\omega)$. To obtain the true amplitude of the spur, its true frequency should be estimated and then the inverse of $D(\omega)$ should be used to correct the amplitude.

De-Aliasing Method:

Because the CTIA undersamples the jitter signal, the sinusoidal jitter components alias to frequencies between 0 and $f_s/2$. However, their true frequency needs to be determined. One can observe that the alias frequency not only depends on the true sinusoidal jitter frequency, but it also depends on the sampling rate. Therefore, varying the sampling rate and observing the variation of the aliased frequencies can determine the true frequency of the sinusoidal jitters. This section describes a method that uses this observation to find the true frequency from multiple aliased frequencies. This operation is referred to herein as "de-aliasing".

Assume that x(t) signal is the sum of several sinusoids. Assuming that the signal x(t) is sampled at the rate of $f_s$, the frequency of aliased and non-aliased components can be computed as below in Eqn. 4:

$$f_a = \begin{cases} f - kf_s, & \text{if } kf_s \leq f < \left(k+\frac{1}{2}\right)f_s \\ kf_s - f, & \text{if } \left(k-\frac{1}{2}\right)f_s \leq f < kf_s \end{cases} \quad \text{for } k = 0, 1, 2, \ldots \qquad \text{Eqn. 4}$$

From Eqn. 4, the aliased frequency $f_a$ can be computed from the real frequency, but the inverse is not true because the value of k is unknown. Now, the signal is sampled twice with the rates of $f_{s1}$, $f_{s2}$, such that their difference satisfies the following equation:

$$f_{max} < \frac{f_{s1} \cdot f_{s2}}{2(f_{s1} - f_{s2})} (f_{s2} < f_{s1}) \qquad \text{Eqn. 5}$$

where $f_{max}$ is the maximum sinusoid frequency in x(t). Under such condition, a single value of k satisfies Eqn. 4 for both sampling rates, providing an extra equation to solve for k and consequently compute the true sinusoid frequencies. The following four cases are possible for a sinusoid with frequency $f_i < f_{max}$:

$$kf_{s1} \leq f < \left(k + \frac{1}{2}\right)f_{s1} \Rightarrow f_{a1} = f_i - kf_{s1} \quad \text{Case 1:}$$

$$kf_{s2} \leq f < \left(k + \frac{1}{2}\right)f_{s2} \Rightarrow f_{a2} = f_i - kf_{s2}$$

$$\left(k - \frac{1}{2}\right)f_{s1} \leq f < kf_{s1} \Rightarrow f_{a1} = kf_{s1} - f_i \quad \text{Case 2:}$$

$$kf_{s2} \leq f < \left(k + \frac{1}{2}\right)f_{s2} \Rightarrow f_{a2} = f_i - kf_{s2}$$

$$\left(k - \frac{1}{2}\right)f_{s1} \leq f < kf_{s1} \Rightarrow f_{a1} = kf_{s1} - f_i \quad \text{Case 3:}$$

$$\left(k - \frac{1}{2}\right)f_{s2} \leq f < kf_{s2} \Rightarrow f_{a2} = kf_{s2} - f_i$$

$$kf_{s1} \leq f < \left(k + \frac{1}{2}\right)f_{s1} \Rightarrow f_{a1} = f_i - kf_{s1} \quad \text{Case 4:}$$

$$\left(k + \frac{1}{2}\right)f_{s2} \leq f < (k + 1)f_{s2} \Rightarrow f_{a2} = (k+1)f_{s2} - f_i$$

The equations above yield the following relations:

Case 1 $f_{a1} - f_{a2} = k(f_{s2} - f_{s1})$     Eqn. 6

Case 2 $f_{a1} + f_{a2} = k(f_{s1} - f_{s2})$     Eqn. 7

Case 3 $f_{a1} - f_{a2} = k(f_{s1} - f_{s2})$     Eqn. 8

Case 4 $f_{a1} + f_{a2} = k(f_{s2} - f_{s1}) + f_{s2}$     Eqn. 9

For any $f_i$, only one of the Eqns. 6, 7, 8, 9 will hold true, which will provide the value of k.

If x(t) is the phase jitter of a clock signal with the frequency of $f_c$, the maximum possible sampling rate is $f_c$, i.e., measuring jitter on all clock edges. This allows measuring jitter frequencies up to $f_c/2$; any higher frequency will inherently alias back to the 0 to $f_c/2$ range. This is the fundamental limitation of using edge phase variation for jitter measurement, however, this limitation is rarely an issue in most practical situations. Therefore, for a clock signal, $f_{max} = f_c/2$. On the other hand, the possible CTIA sampling rates for a clock signal are $f_c/M$, where M is an integer, because the jitter signal can only be sampled at the clock edges. For sampling rate of $f_c/M$, it is sufficient to measure jitter of every other M-th edge.

If we select $f_{s1} = f_c/M$ and $f_{s2} = f_c/(M+1)$, all the detectable jitter frequencies can be uniquely de-aliased because from Eqn. 5:

$$f_{max} < \frac{\left(\frac{f_c}{M}\right) \cdot \left(\frac{f_c}{M+1}\right)}{2\left(\frac{f_c}{M} - \frac{f_c}{M+1}\right)} = \frac{f_c}{2} \quad \text{Eqn. 10}$$

Sinusoidal Phase Jitter Measurement:

This section describes the methodology that utilizes the low frequency noise attenuation and de-aliasing to estimate the frequency and amplitude of sinusoidal jitter components in a clock signal from the undersampled time stamps. The different steps of such methodology follow.

I. Sampling:

The sampling process involves measuring a number of time intervals organized in several blocks, such that the sampling interval, $\Delta E$, and time interval span, $E_{TI}$ is constant in each block. $N_B$ blocks of measurements are taken, each containing $N_s$ samples. The blocks cover K values of $E_{TI}$ and for each value of $E_{TI}$, M values of $\Delta E$ are selected, resulting in $N_B = K \cdot M$ blocks.

I(A). Time Interval Span Selection:

The $E_{TI}$ values act as difference filter parameters and cause a trade off between dynamic range consideration for high and low frequency spectral peaks. Two possible strategies may be employed for $E_{TI}$ selection. First, the noise characteristics of the signal may be considered to select optimal $E_{TI}$ values such that the desired high and low frequency peaks are detected. Second, small $E_{TI}$ values may be selected for detecting the high frequency peaks, and larger values for detecting the low frequency peaks. The first strategy is more suitable for applications that require fast measurements because it typically requires less sampling and processing time, such as production test. The latter one may lead to longer measurement time, but can generate more complete and accurate estimates of spectral peaks. This may be desired in characterization applications.

For a typical production test application, two or three values of $E_{TI}$ are sufficient. The following guidelines help to select $E_{TI}$ values:

1. $E_{TI}(1)$: Select the smallest possible value, e.g. $E_{TI}(1) = 1$, which is equivalent to period measurements.
2. $E_{TI}(2)$: The second possible smallest value. This value depends on the clock frequency and the minimum start-to-stop arming delay. For low frequency clock signals, $E_{TI}(2) = 3$ or 5 is the best choice. For higher frequency clocks, the lowest possible value should be calculated as below:

$$E_{TI} = \left\lceil \frac{\tau_{st-to-sp}}{T_c} \right\rceil \quad \text{Eqn. 11}$$

where $\lceil X \rceil$ represents the closest integer to X that is larger than X, and $\tau_{st-to-sp}$ is the minimum delay between START and STOP edges of the time intervals supported by the instrument.

3. $E_{TI}(3)$: This value is selected to detect lower frequency spectral peaks. It should be selected based on the minimum desired frequency to be detected, as below:

$$E_{TI}(3) > \left\lceil \frac{0.02 f_c}{f_{min}} \right\rceil \text{ and lcd }(E_{TI}(3), E_{TI}(2)) = 1 \quad \text{Eqn. 12}$$

where $f_{min}$ is the minimum frequency to be detected, and lcd(X) is the largest common divisor of X. Above equation, however, may result in a large $E_{TI}(3)$, which may impact the dynamic range for higher frequencies excessively. In such cases, an smaller empirical value should be selected. Note that $E_{TI}(3)$ and $E_{TI}(2)$ should be co-prime to ensure the resulting difference filter nulls do not coincide. If such optimal value cannot be found, it may be necessary to select a fourth $E_{TI}$ value. In such case, $E_{TI}(3)$ is computed from Eqn. 12.

4. $E_{TI}(4)$: This is not necessary if an optimal value of $E_{TI}(3)$ can be found to satisfy both high and low frequency dynamic range requirement. Otherwise, $$E_{TI}(4) > 2 E_{TI}(3) \text{ and } lcd(E_{TI}(4), E_{TI}(3)) = 1 \quad \text{Eqn. 13}$$

If $E_{TI}(4)$ becomes necessary, then rest of the algorithm should be performed twice, once with $E_{TI}(1)$ and $E_{TI}(2)$ for higher frequency peaks and another time with $E_{TI}(3)$ and $E_{TI}(4)$ for detecting lower frequency peaks.

I (B). Sampling Rate Selection:

The sampling rate is related to the $\Delta E$ as below:

$$f_s = \frac{1}{\Delta E \cdot T_c} \quad \text{Eqn. 14}$$

Different $\Delta E$ values effectively vary the sampling rate. De-aliasing requires only two $\Delta E$ values, but it may be necessary to select a third value and perform de-aliasing twice for ensuring that no false peaks are added to the list of valid peaks. Select the $\Delta E$ as below:

1. $\Delta E(1)$: The smallest possible prime number that satisfies the minimum sampling rate of the instrument, as below:

$$\Delta E(1) > \left\lceil \frac{T_{st(min)}}{T_c} \right\rceil \text{ and } \Delta E(1) \text{ is prime} \quad \text{Eqn. 15}$$

2. $\Delta E(2)$: $\Delta E(2)=\Delta E(1)+1$. This selection ensures the effective aliasing frequency after de-aliasing is increased to $f_c/2$ when using $\Delta E(2)$ and $\Delta E(1)$ for de-aliasing.
3. $\Delta E(3)$: $\Delta E(3)=\Delta E(1)-1$. This selection ensures the effective aliasing frequency after de-aliasing is increased to $f_c/2$ when using $\Delta E(3)$ and $\Delta E(1)$ for de-aliasing.

There may be other prime numbers that satisfy Eqn. 15 that although not smallest, but are fairly close to the smallest. In certain situations, it may be advantageous to select such numbers. For example, $\Delta E(1)$ selection that results in $\Delta E(2)$ and $\Delta E(3)$ values such that these values prevent the expected spectral peak frequencies to fall in close neighborhood. Such consideration is application dependent.

I (C). Number of Samples:

Three primary considerations are important is selecting the number of samples in each block, $N_s$: measurement time, frequency resolution, and dynamic range. With regard to the measurement time, it should be noted that a larger number of samples would increase both sampling and processing time, which leads to longer measurement time. With regard to frequency resolution, larger $N_s$ increases the "record time" in each block, where record refers to the samples measured in one block. The frequency resolution of FFT operation in later processing steps is inversely proportional to the record time. Higher resolution makes it possible to distinguish the spectral peaks that may fall in close FFT bins. With regard to dynamic range, larger $N_s$ also increases the dynamic range because the noise floor spreads over larger number of FFT bins. Typically, the dynamic range improves proportionally to $\sqrt{N_s}$ because the spectral peak amplitude increases proportionally to $N_s$ while the noise floor increases proportionally to $\sqrt{N_s}$. The trade-off among the three considerations provides an optimal $N_s$ for a given application.

II. Jitter Spectrum Peak Detection:

In the previous section, $N_B$ blocks are sampled, denoted by $B(k,m)$, $k=1,\ldots,K$ and $m=1,\ldots,M$. In this step, first, the average time interval is subtracted from the measured samples in each block to eliminate the constant offsets in the blocks, as below:

$$TIm = TI - \overline{TI} \quad \text{Eqn. 16}$$

Then, the FFT is computed for resulting sequence. Prior to FFT computation, it is recommended to use zero-padding for efficient FFT computation and also ensuring all FFT sequence length are the same. Windowing should also be applied to TI-$\overline{TI}$ sequence prior to FFT computation to reduce the windowing sidelobes, which may produce false peaks that may be detected by the peak detection algorithm. The result of this processing is K.M FFT sequences, $TIm\_fft_{k,m}(i)$, $k=1,\ldots,K$ and $m=1,\ldots,M$.

Next, the average of the K FFT sequences for each selection of $\Delta E$ is computed to yield M average FFT sequences $\overline{TIm\_fft_m}(i)$. The averaging operation smoothes the noise floor.

The next step is to detect the frequency peaks in each average FFT sequence. An example of a peak detection algorithm is disclosed in U.S. patent application entitled "Periodic Jitter (PJ) Measurement Methodology", filed on Dec. 8, 2005 and assigned U.S. Ser. No. 11/301,275, which is incorporated by reference herein for all purposes. Upon completion of peak detection, a set of peak frequencies and amplitudes are generated for each $m=1,\ldots,M$.

III. Random Jitter Estimation:

Each of the $TIm\_fft_{k,m}(i)$ includes a noise floor. The noise floor power can be estimated by eliminating the frequency peak and computing the power of the rest of the sequence. This estimate can provide an estimate of phase noise based on $1/f^2$ model, as described later in the Section entitled "Phase Noise Estimation."

IV. De-Aliasing:

The FFT sequences $TIm\_fft_{k,m}(i)$ are subject to aliasing because of undersampling. The de-aliasing includes the following steps. First, for $m=1$ and $m=2$, perform de-aliasing on the set of peaks estimated from peak detection step. This operation yields real frequencies of the jitter spectral peaks. Details of an exemplary de-aliasing algorithm are presented in the subsequent section entitled "De-Aliasing Algorithm." Second, the same operation can be performed on the peaks corresponding to $m=1$ and $m=3$, to yield a second set of real frequencies. The common frequencies in both de-aliased sets represent the valid real peaks.

De-aliasing alone may only need the first step outlined above, but the second de-aliasing step greatly reduces the likelihood of declaring some false peaks as valid. The procedure yield a list of real peak frequencies $f_l$, $l=1,\ldots,L$.

V. Amplitude Correction:

Upon detection of valid peaks and their real frequencies, the corresponding amplitude of each should be estimated. First, the difference filter inverse amplitude for each of the selected $E_{TI}(k)$, $k=1,\ldots,K$ should be computed as follows:

$$\frac{1}{|D_k(f_l)|} = \left|\frac{1}{2\sin(\pi \cdot f_l \cdot E_{TI}(k) \cdot T_c)}\right| \text{ for } l=1,\ldots,L \quad \text{Eqn. 17}$$

Second, the correction factor should be applied to the amplitudes corresponding to the peaks in the blocks $B(k,1)$, $k=1,\ldots,K$. The results are K corrected amplitudes for each real peak frequency $f_l$. Averaging the K estimates from the K different blocks reduces the impact of noise and provides more accurate amplitude estimation. The result of amplitude correction is $A_l$, $l=1,\ldots,L$. Note that the amplitudes detected for blocks with $m=1$ are selected in amplitude correction. The reason is that because ΔE(1) is a prime number, it is very unlikely that some aliased components fall in the same FFT bin, which would cause error in amplitude estimation.

Estimating Phase Noise from Phase Jitter:

Phase noise has two main sources, random and periodic. This section describes how to estimate phase noise parameters from phase jitter estimate.

I. Random Phase Noise Estimate:

The random portion may have $1/f$, $1/f^2$, $1/f^3$ behaviors. The dominant random phase noise behavior is $1/f^2$ over a large frequency range for many oscillators. It can be shown that the $1/f^2$ can be characterized by two parameters, the random period jitter standard deviation, $\sigma_{RJ}$, and the oscillator frequency $f_c$, as below:

$$PN_R(\Delta f) = 10 * \log 10\left(\frac{f_{osc}^3 \cdot \sigma_{RJ\_P}^2}{(\pi \cdot f_{osc}^3 \cdot \sigma_{RJ\_P}^2)^2 + (\Delta f)^2}\right) \quad \text{Eqn. 18}$$

This estimate relies on Gaussian behavior of random phase noise. Lorentzian noise behavior, which is common for PLL-based oscillators, requires a different mapping function than Eqn. 18. However, Eqn. 18 still is valid for frequencies greater than PLL loop bandwidth.

To estimate RJ, one method is to use the RJ estimate from each block. Compute the average of this estimate to obtain only M estimates:

$$\sigma_{RJ(m)} = \frac{1}{K}\sum_{k=1}^{K} \sigma_{RJ(k,m)} \quad \text{Eqn. 19}$$

Compute an estimate of period jitter as below:

$$\sigma_{RJ\_P} = \frac{1}{M}\sum_{m=1}^{M} \frac{\sigma_{RJ(m)}^2}{E_{TI}(m)} \quad \text{Eqn. 20}$$

The random phase noise is expressed as db/Hz.

II. Phase Noise Spurious Peaks (Spurs):

The phase noise spurious peaks corresponds to the phase variations whose energy in concentrated in narrow frequency range. The phase noise spurious and sinusoidal timing jitter are related through the following equation:

$$PN_{SPUR}(f_l) = 20 \cdot \log_{10}\left(\frac{\pi \cdot A_l}{T_c}\right) \quad \text{Eqn. 21}$$

Eqn. 21 is valid when $A_l < 0.15 \cdot f_c$ with better than 5% accuracy, e.g., $A_l < 450$ ps at $f_c = 300$ MHz. This condition is true for most practical oscillators. For larger spurs, the mapping function $\sin(\pi A_l/T_c)$ may be used instead of $\pi A_l/T_c$ in Eqn. 21.

Difference Filter

An initial exemplary step of the disclosed methodology is to reduce the impact of large low frequency phase noise. This can be done by low pass filtering the phase noise. We use a different filter, which has a low pass behavior at low frequencies and is easily implemented in time domain. The difference filter is defined as follows.

Assuming x(t) a time domain signal, the difference filter output, y(t), is obtained by subtracting a delayed version of a signal from that signal:

$$y(t)=x(t)-x(t-\tau) \quad \text{Eqn. 22}$$

where τ is the filter delay parameter. The frequency response of the difference filter, D(ω) is computed as below:

$$Y(\omega) = X(\omega) - e^{-j\omega\tau}X(\omega) \quad \text{Eqn. 23}$$
$$= e^{-j\omega\tau/2}[e^{j\omega\tau/2}X(\omega) - e^{-j\omega\tau/2}X(\omega)]$$
$$= [2\sin(\omega\tau/2)e^{-j\omega\tau/2}]X(\omega)$$

Therefore, $$D(\omega)=2\sin(\omega\tau/2)e^{-j\omega\tau/2} \quad \text{Eqn. 24}$$

Figure 5:
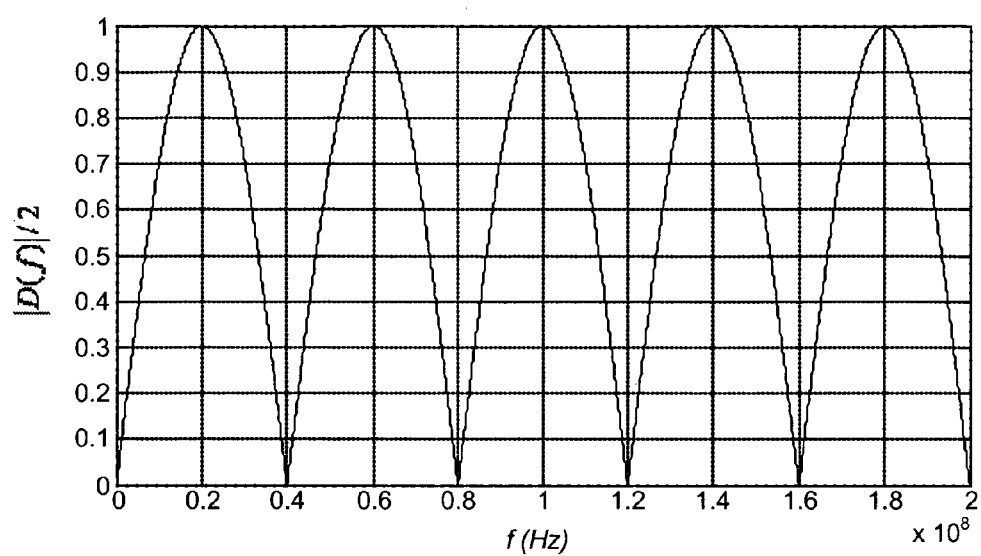
FIG. 5 provides a graphical illustration of exemplary frequency response for a difference filter used in accordance with aspects of the presently disclosed technology.

An example of D(ω) is illustrated in FIG. 5 for a signal that is sampled with sampling rate of $\omega_s$ and filter delay parameter of $\omega_s\tau/2=5\pi$. The filter has sinusoidal shape in frequency domain and delays the resulting signal by τ/2. It has a null at ω=0 and a first peak at $f=\omega/2\pi=1/2\tau$, which attenuates frequencies between 0 and ω=1/4τ. The filter does not pass higher frequencies evenly due to additional nulls at multiples of ω=1/τ.

De-Aliasing Algorithm

It should be appreciated that the following notations and definitions provided in Table Two are used throughout this section of the specification to refer to various parameters associated with the disclosed technology.

TABLE TWO

ADDITIONAL NOTATIONS AND DEFINITIONS

| Notation | Definition |
|---|---|
| x(t) | Sampled signal |
| $f_{s1}$ | Sampling rates #1 |
| $f_1(n_1)$ $n_1 = 1, \ldots, N_1$ | Peak frequency set corresponding to sampling rate #1 |
| $f_{s2}$ | Sampling rates #2 |
| $f_2(n_2)$ $n_2 = 1, \ldots, N_2$ | Peak frequency set corresponding to sampling rate #2 |
| $f_{sd} = f_{s1} - f_{s2}$ | Difference of sampling rates (NOTE: Assume that $f_{sd} > 0$) |

Assume that two sets of frequencies are obtained from two different FFT sequences. FFT sequence corresponds to sampling rates $f_{s1}$ and $f_{s2}$. The de-aliasing algorithm utilizes the fact that the signal frequency components move in frequency domain as sampling rate varies, and that this movement is highly correlated with the difference of sampling rates.

Depending on the location of a frequency component to sampling rate, the aliased components may move in three different ways versus sampling rate. Each frequency belongs to one of these types, denoted by A, B, and C. The following describes an exemplary code structure for how to identify the aliased components belonging to each type and corresponding equation for estimating the real frequency of the component (unaliased frequency).

j=1

For $n_1=1$ to $N_1$
  For $n_2=1$ to $N_2$ $S_A = f_1(n_1) - f_2(n_2)$ $S_B = f_1(n_1) + f_2(n_2)$ $S_C = f_1(n_1) + f_2(n_2) - f_{s2}$ $R_A = S_A - \text{round}(S_A/f_{sd})*f_{sd}$ $R_B = S_B - \text{round}(S_B/f_{sd})*f_{sd}$ $R_C = S_C - \text{round}(S_C/f_{sd})*f_{sd}$ $Q_A = \text{round}(S_A/f_{sd})$ $Q_B = \text{round}(S_B/f_{sd})$ $Q_C = \text{round}(S_C/f_{sd})$ $D_{A\_sg} = \text{sign}(D_A)$ if $|R_A| < (1.02 f_{res})$ $f_{ua}(j) = |Q_A| f_{s1} - D_{A\_sg} f_1(n_1)$ $j = j+1$ $n_{j1}(j) = n_1; n_{j2}(j) = n_2$ end if $|R_B| < (1.02 f_{res})$ $f_{ua}(j) = |Q_B| f_{s1} - f_1(n_1)$ $j = j+1$ $n_{j1}(j) = n_1; n_{j2}(j) = n_2$ end if $|R_C| < (1.02 f_{res})$ $f_{ua}(j) = |Q_C| f_{s1} + f_1(n_1)$ $j = j+1$ $n_{j1}(j) = n_1; n_{j2}(j) = n_2$ end
  end
end $f_{ua}(j)$ is the list of dealiased frequencies.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. A method of measuring signal jitter using a multiple sampling frequency method, said method comprising the following steps:
   obtaining a plurality of time measurements in multiple respective blocks of measurements for a given signal;
   determining from the plurality of obtained time measurements the frequency and amplitude of noise spurs present in each respective block of measurements;
   de-aliasing the noise spurs from said determining step to determine their real frequencies of occurrence; and
   outputting a signal indicative of the measure signal jitter.

2. The method of claim 1, wherein said time measurements comprise time-stamp measurements.

3. The method of claim 1, further comprising a step of applying a mapping function to each noise spur to obtain an estimate of phase noise spurs from the periodic signal jitter measurements.

4. The method of claim 1, wherein said time measurements comprise time interval measurements.

5. The method of claim 4, wherein said time interval measurements are obtained for the given signal in multiple respective blocks of measurements, wherein a sampling interval and time interval span is selected to be constant in each block, and wherein at least two different sampling intervals are employed.

6. The method of claim 5, wherein the sampling interval selected in said obtaining step corresponds to a prime number (P) of clock or data cycles for at least one block of measurements and to (P+1) or (P−1) clock or data cycles for at least one additional block of measurements.

7. The method of claim 5, wherein the sampling interval selected in said obtaining step corresponds to a prime number (P) of clock or data cycles for at least one block of measurements, to (P+1) clock or data cycles for at least one block of measurements, and to (P−1) clock or data cycles for at least one block of measurements.

8. The method of claim 4, wherein said step of determining from the plurality of obtained time interval measurements the frequency and amplitude of noise spurs in each respective block of measurements comprises the steps of:
   determining an average time interval for each block;
   subtracting the average time interval from the measured samples in each block;
   transforming the time interval values into a plurality of frequency sequences;
   averaging selected frequency sequences to smooth noise floor in the samples; and
   detecting frequency peaks from each averaged set of frequency sequences.

9. The method of claim 8, further comprising a step of adding zero values to each block of measurements from said obtaining step such that the total number of measurements in each block including added zero values is equal to a power of two.

10. The method of claim 8, wherein said transforming step comprises performing a fast Fourier transform.

11. The method of claim 8, further comprising a step before said transforming step of applying a windowing function to each time interval value to reduce signal sidelobes.

12. A method of estimating phase noise of a signal from signal jitter measurements, said method comprising the steps of:
   obtaining a first set of time-stamp measurements for a plurality of selected signal edges within a given signal, wherein said first set of time-stamp measurements is obtained at a first selected sampling rate;
   using the first set of obtained time-stamp measurements to produce an estimate of the frequency and amplitude of signal peaks in the phase jitter spectrum; and
   outputting a signal indicative of phase noise based on the estimate produced.

13. The method of claim 12, further comprising a step of filtering the given signal to attenuate low frequency random noise levels.

14. The method of claim 13, wherein said obtaining step comprises obtaining at least first and second sets of time-stamp measurements for a plurality of selected signal edges within the given signal, wherein each said respective set of time-stamp measurements is obtained at a respective sampling rate, and wherein measurements are obtained for at least two different sampling rates.

15. The method of claim 14, wherein a plurality of blocks of measurements are obtained for each different sampling rate such that the number of clock or data cycles corresponding to the time interval in each block is different from that of other blocks.

16. The method of claim 13, wherein said filtering step is effected by use of a low-pass difference filter, and wherein said method further comprises a step of correcting the amplitude of each signal peak to account for amplitude modulation occurring from the difference filter.

17. The method of claim 12, wherein said step of obtaining a first set of time stamp measurements more particularly comprises:
obtaining a plurality of time-stamp measurements in multiple respective blocks of measurements for a given signal;
determining from the plurality of obtained time-stamp measurements the frequency and amplitude of noise spurs in each respective block of measurements; and
de-aliasing the noise spurs from said determining step to determine their real frequencies of occurrence.

18. The method of claim 12, wherein said plurality of time-stamp measurements are obtained with a selected sampling interval that corresponds to a prime number (P) of clock or data cycles for at least one block of measurements, and to (P+1) or (P−1) clock or data cycles for at least one additional block of measurements.

19. The method of claim 12, wherein said plurality of time-stamp measurements are obtained with a selected sampling interval that corresponds to a prime number (P) of clock or data cycles for at least one block of measurements, to (P+1) clock or data cycles for at least one block of measurements and to (P−1) clock or data cycles for at least one block of measurements.

20. The method of claim 12, wherein said time-stamp measurements are configured to provide information including time interval measurements.

21. The method of claim 20, wherein said time interval measurements are obtained for the given signal in multiple respective blocks of measurements, wherein a sampling interval and time interval span is selected to be constant in each block, and wherein at least two different sampling intervals are employed.

22. The method of claim 21, wherein the sampling interval selected in said obtaining step corresponds to a prime number (P) of clock or data cycles for at least one block of measurements and to (P+1) or (P−1) clock or data cycles for at least one additional block of measurements.

23. The method of claim 21, wherein the sampling interval selected in said obtaining step corresponds to a prime number (P) of clock or data cycles for at least one block of measurements and, to (P+1) clock or data cycles for at least one block of measurements, and to (P−1) clock or data cycles for at least one block of measurements.

24. The method of claim 20, wherein said step of determining from the plurality of obtained time interval measurements the frequency and amplitude of noise spurs in each respective block of measurements comprises the steps of:
determining an average time interval for each block;
subtracting the average time interval from the measured samples in each block;
transforming the time interval values into a plurality of frequency sequences;
averaging selected frequency sequences to smooth noise floor in the samples; and
detecting frequency peaks from each averaged set of frequency sequences.

25. The method of claim 24, further comprising a step of adding zero values to each block of measurements from said obtaining step such that the total number of measurements in each block including added zero values is equal to a power of two.

26. The method of claim 24, wherein said transforming step comprises performing a fast Fourier transform.

27. The method of claim 24, further comprising a step before said transforming step of applying a windowing function to each time interval value to reduce signal sidelobes.

28. The method of claim 12, further comprising a step of estimating random phase noise of the signal.

29. The method of claim 28, wherein said step of estimating random phase noise of the signal comprises the steps of:
removing frequency peaks in the signal representative of spurious noise; and
determining an estimate of random phase noise modeled by $1/f^2$ behavior.

30. The method of claim 29, wherein said step of determining an estimate of phase noise modeled by $1/f^2$ behavior comprises determining the standard deviation of the random jitter and the oscillator frequency.

31. The method of claim 28, further comprising a step of combining the estimate of random phase noise and the determined periodic noise spurs to obtain a complete phase noise estimate.

32. A measurement system configured to obtain phase jitter estimates for a signal and obtain a phase noise estimate therefrom, said measurement system comprising:
at least one measurement channel for obtaining a plurality of time measurements in multiple respective blocks of measurements of the signal; and
a processor circuit coupled to said at least one measurement channel, said processor circuit configured to determine from the plurality of obtained time measurements the frequency and amplitude of noise spurs present in each respective block of measurements and to de-alias the noise spurs to determine their real frequencies of occurrence.

33. The measurement system of claim 32, wherein the time measurements obtained by said at least one measurement channel comprise time-stamp measurements.

34. The measurement system of claim 32, wherein the time measurements obtained by said at least one measurement channel comprise time interval measurements.

35. The measurement system of claim 34, wherein a sampling interval and time interval span is selected to be constant in each block of measurements.

36. The measurement system of claim 35, wherein the sampling interval selected for obtaining measurements by the at least one measurement channel corresponds to a prime number (P) clock or data cycles for at least one block of measurements and to (P+1) or (P−1) clock or data cycles for at least one additional block of measurements.

37. The measurement system of claim 35, wherein the sampling interval selected for obtaining measurements by the at least one measurement channel corresponds to a prime number (P) clock or data cycles for at least one block of measurements, to (P+1) clock or data cycles for at least one block of measurements, and to (P−1) clock or data cycles for at least one block of measurements.

38. The measurement system of claim 34, wherein said processor circuit is further configured in accordance with said feature of determining from the plurality of obtained time interval measurements the frequency and amplitude of noise spurs in each respective block of measurements to:
   determine an average time interval for each block;
   subtract the average time interval from the measured samples in each block;
   transform the time interval values into a plurality of frequency sequences;
   average selected frequency sequences to smooth noise floor in the samples; and
   detect frequency peaks from each averaged set of frequency sequences.

39. The measurement system of claim 38, wherein said processor circuit is further configured in accordance with said transforming feature to add zero values to each block of measurements from said obtaining step such that the total number of measurements in each block including added zero values is equal to a power of two.

40. The measurement system of claim 38, wherein said transforming feature comprises performing a fast Fourier transform.

41. The measurement system of claim 34, wherein said processor circuit is further configured to apply a windowing function to each time interval measurement to reduce signal sidelobes.

42. The measurement system of claim 32, wherein said processor circuit is further configured to estimate random phase noise of the signal.

43. The measurement system of claim 42, wherein said processor circuit is further configured in accordance with said feature of estimating random phase noise of the signal to:
   remove frequency peaks in the signal representative of spurious noise; and
   determine an estimate of random phase noise modeled by $1/f^2$ behavior.

44. The measurement system of claim 43, wherein the determination by said processor circuit of an estimate of phase noise modeled by $1/f^2$ behavior comprises determining the standard deviation of the random jitter and the oscillator frequency.

45. The measurement system of claim 32, wherein said processor circuit is further configured to filter the given signal to attenuate low frequency random noise levels.

46. The measurement system of claim 45, wherein the multiple respective blocks of measurements obtained by said at least one measurement channel are obtained at different sampling rates such that the number of clock or data cycles corresponding to the time interval in each block is different from that of other blocks.

47. The measurement system of claim 32, wherein said processor circuit is further configured to apply a mapping function to each noise spur to obtain an estimate of periodic phase noise.

48. The measurement system of claim 32, wherein said at least one measurement channel comprises a pair of comparators, multiplexers and interpolators coupled to a continuous time counter and a continuous event counter.

49. The measurement system of claim 32, wherein said processor circuit comprises:
   a computer-readable medium for storing executable instructions corresponding to the steps of determining from the plurality of obtained time interval measurements the frequency and amplitude of noise spurs in each respective block of measurements and de-aliasing the noise spurs to determine their real frequencies of occurrence; and
   a computer coupled to said computer-readable medium for executing the instructions stored therein.

50. The measurement circuit of claim 49, wherein said computer-readable medium comprises one or more of a server database, a magnetic tape or disk, a CD-ROM, a flash, EEPROM, or other nonvolatile memory.

* * * * *